United States Patent

Gaynes et al.

Patent Number: 5,813,870
Date of Patent: Sep. 29, 1998

[54] SELECTIVELY FILLED ADHESIVES FOR SEMICONDUCTOR CHIP INTERCONNECTION AND ENCAPSULATION

[75] Inventors: Michael Anthony Gaynes, Vestal, N.Y.; Jaynal Abedin Molla, Chandler, Ariz.; Steven Paul Ostrander, Scotai, N.Y.; Judith Marie Roldan, Ossining, N.Y.; George John Saxenmeyer, Apalachin, N.Y.; George Frederick Walker, New York, N.Y.

[73] Assignee: International Business Machines Corporation, Armonk, N.Y.

[21] Appl. No.: 678,852

[22] Filed: Jul. 12, 1996

[51] Int. Cl.⁶ ........................................................ H01R 4/58
[52] U.S. Cl. .................................................................. 439/91
[58] Field of Search .................................. 439/86, 87, 88, 439/89, 90, 91

[56] References Cited

U.S. PATENT DOCUMENTS

| | | |
|---|---|---|
| 4,731,282 | 3/1988 | Tsukagoshi et al. . |
| 4,814,040 | 3/1989 | Ozawa ........................................ 439/91 |
| 5,059,262 | 10/1991 | Calhoun et al. . |
| 5,174,766 | 12/1992 | Yoshizawa et al. ....................... 439/91 |
| 5,180,888 | 1/1993 | Sugiyama et al. . |
| 5,185,073 | 2/1993 | Bindra et al. . |
| 5,207,585 | 5/1993 | Byrnes et al. . |
| 5,221,417 | 6/1993 | Basavanhally . |
| 5,275,856 | 1/1994 | Calhoun et al. . |

FOREIGN PATENT DOCUMENTS 2223135  3/1990  United Kingdom .

OTHER PUBLICATIONS

Kulesza et al. (1992) "Solderless Flip Chip Technology—Electrical Conductive Polymer Plays Key Role" Hybrid Circuit Technology, pp. 24–27.

Brefeldt et al. (1989) "Evaluation of Conductive Adhesives as a Medium to Attach Surface Mount Components and Tab Parts to Printed Circuit Boards" Proc. Tech. PGM, Nepcon West, vol. 1, pp. 496–506.

Honore et al. (1992) "Reliability Testing of Conductive Adhesives", Nepcon West '92, pp. 1372–1380.

Chang et a al. (1992) "Design Considerations for the Implementation of Anisotropic Conductive Adhesive Interconnection" Nepcon West '92, pp. 1381–1389.

Chang et al. (1993) "Accelerated Life Test of Z–Axis Conductive Adhesives" IEEE Transactions on Componets, Hybrids, and Manufacturing Technology, vol. 16 No. 8, pp. 836–842.

Chang et al. (1993) "An Overview and Evaluation of Anisotropically Conductive Adhesive Films for Fine Pitch Electronic Assembly" IEEE Transations on Components, Hybrids, and Manufacturing Technology, vol. 16, No. 8, pp. 828–835.

Basavanhally et al. "Direct Chip Interconnect with adhesive–Connector Films" (1992), pp. 487–491.

*Primary Examiner*—Neil Abrams
*Assistant Examiner*—Eugene G. Byrd
*Attorney, Agent, or Firm*—Scully, Scott, Murphy & Presser; Daniel P. Morris, Esq.

[57] ABSTRACT

Dielectric adhesive film patterned with clusters of electrically conductive filaments that extend through the film thickness for providing electrical interconnection and encapsulation. The dielectric adhesive material is reworkable. The clusters are formed by selectively electroplating a noble metal at a high current density.

22 Claims, 2 Drawing Sheets

SELECTIVELY FILLED ADHESIVES FOR SEMICONDUCTOR CHIP INTERCONNECTION AND ENCAPSULATION

BACKGROUND OF THE INVENTION

1. Field of the Invention

The present invention relates to electrical interconnections for semiconductor devices and, in particular, to an adhesive film which contains contacts on both sides for interconnecting and encapsulating a semiconductor chip or wafer for testing or for utilization.

2. Discussion of the Prior Art

Semiconductor devices or chips and other electrical devices normally are electrically interconnected for testing, burn-in and utilization. Interconnection methods have included rigid probes and contacts, flexible probes and contacts, wire bonding, soldering and welding. The topology of the interconnections on a chip has varied from a line or linear array of peripherally spaced pads, bumps or contacts to an area array of two dimensionally spaced pads or bumps. The pads or bumps in either a linear or area array normally have a uniform width and center to center spacing in the array. The array of contacts in an area array are normally arranged in a pattern such as rows and columns orthogonal to one another. The trend in integrated circuit chips or dies is for denser arrays of contacts and for more contacts per chip. One manufacturer, International Business Machines Corporation, Armonk, N.Y., uses a contact called a C4 bump which extends above the integrated circuit by about 0.125 millimeters and which is composed mostly of lead and tin ($Pb-S_n$) and is hemispherical or ellipical in cross-section.

U.S. Pat. No. 5,207,585 discloses an apparatus for providing electrical contact between an array of first contacts on a rigid probe and a corresponding array of contacts on an electrical device comprising a flexible membrane, an array of electrodes formed in the flexible membrane and extending above the upper surface and below the lower surface. The flexible membrane has a thickness to form a curved upper and lower surface and an elasticity to permit the electrodes to move independently of each other. The electrodes have a plurality of raised portions and recessed portions. The raised portions penetrate the surface of the contacts and the recessed portions limit the penetration.

Polymeric adhesives containing electrically conductive fillers offer an alternative to solder for low impedance electrical interconnection. These conductive adhesives avoid the health and environmental concerns associated with lead alloys and flux cleaning process wastes, and may provide more fatigue resistant electrical joining.

Conductive adhesives are commercially available as anisotropic (z-axis) conductive films or isotropic conductive pastes. Anisotropic conductive adhesives are limited to non-gap filling flex-to-flex or flex-to-rigid applications. Typically, coplanarity tolerances preclude the use of anisotropic conductive films in rigid-to-rigid applications. An example of rigid-to-rigid application that uses anisotropic adhesives is chip-on-glass. In chip-on-glass (COG) bonding, tight coplanarity tolerances are achieved (<10 microns) because the inherently flat nature of glass/silicon surface grinding is used. Although anisotropic conductive adhesives are commonly used in high impedance tolerant applications such as LCD's, application to low impedance is new art. Particle density, geometry and polymeric creep detract from low and stable joint resistance. Dispensing obstacles restrict the deposition geometries and limit the conductive filler concentrations for isotropic conductive adhesives. "Reliability Testing of Conductive Adhesives," J. P. Honore et al., Nepcon West '92, pp. 1372–1380, describes the use of silver filled isotropically electrically conductive adhesives to attach both discrete surface mount devices as well as active surface mount devices. Contact resistance data reported indicate large increases by a minimum of 160%. Typically, silver flake aligns parallel to pad surfaces of the adherents to be interconnected. Consequently, sharp asperity contact between flake and pad is mild, leading to contact resistance degradation. "Solderless Flip chip Technology," F. Kulesza et al., Fed. 1992, Hybrid Circuit Technology, describes flip chip interconnect with electrically conductive adhesive. Poor interconnect reliability is implicit since chip receives conductive epoxy which is partially cured (B staged). The carrier receives the same conductive adhesive prior to chip placement. Cured joint has an extra interface—B staged chip epoxy bump to adhesive paste on carrier. Polymer skinning at this interface will adversely impact electrical conductance. "Accelerated Life Test of Z-Axis Conductive Adhesive," D. Chang et al., IEEE Trans. Components, Hybrid Mfg. Tech., Vol. 16, No. 8, Dec. 1993, describes reliability test results for anisotropic conductive adhesives, which shows silver migration shorting from particle filler. U.K. Patent GB 2 223 135 B directed to an electrically conductive adhesive tape describes achieving a higher particle loading while maintaining x y plane isolation between particles. Higher loading provides lower contact resistance. U.S. Pat. No. 5,275,856 describes a patterned anisotropic conductive adhesive that has perforations that are filled with a conductive paste. U.S. Pat. No. 5,180,888 describes a particle coating concept that allows higher filler loadings than typical anisotropic adhesives. Improved electrical contact resistance is achieved by increasing the number of particles that interconnect per area. Particles are coated with an insulating coating that ruptures between pads to be interconnected during bonding, exposing and freeing an electrically conductive sublayer. In the area away from pads to be joined the particle coating does not rupture. U.S. Pat. No. 5,300,340 discloses an anisotropic adhesive that utilizes harder particles than the pad metallurgies to be interconnected. A glass particle with a plating is considered a hard particle. The hard particle is expected to deform and break through the top surface metallurgy and give a reliable interconnect. U.S. Pat. No. 5,225,966 discloses an anisotropic adhesive that tolerates an oversized conductive particle in the film. A soft compliant metal is applied to the surface of the pads to be interconnected. The large particle in the adhesive deforms the soft metal surface allowing the major population of smaller particles to interconnect. U.S. Pat. No. 5,221,417 uses a photolithographic process to define an array of ferromagnetic pads. Ferromagnetic particles are positioned on these pads and then the field of particles is captured in an adhesive film. U.S. Pat. No. 4,731,282 uses particle agglomerates to provide z axis conduction. Within particle agglomerates are several particle-particle interfaces that are held together mechanically by the cured adhesive. These several interfaces will contribute to poorer reliability for the overall interconnect.

In another prior art technique, chips with aluminum pads are plated with nickel and gold and then bonded with isotropically electrically conductive adhesive. The disadvantage is that the adhesive material is thermosetting. The technique does not offer encapsulation, and a separate encapsulation step would be required.

U.S. Pat. No. 5,059,262 discloses a patterned anisotropic adhesive for flip chip interconnect to a flexible substrate.

Clusters of 10 micron sized conductive spherical particles are defined to a desired footprint. One surface of the particle is flat. A flat surface is the least preferred geometry as high normal forces are necessary to create reliable asperity to asperity contact.

SUMMARY OF THE INVENTION

The present invention is directed to dielectric adhesive films patterned with isolated clusters of electrically conductive particles in the form of continuous metal filaments that extend within or through the film thickness. The dielectric adhesive film structure will facilitate electrical interconnection and encapsulation for low impedance, re-workable, solder free electrical joining. These patterned clusters can interconnect over gaps as much as 0.002". The continuous metal filaments eliminate problems inherent to adhesives that rely on particle-to-article contact for electrical conduction. A highly reliable interconnection to conductor pads is achieved which provides high stress contact with low normal force.

Fabrication of these films is achieved by plating a personalized pattern of highly branched metallurgical filaments. The pattern matches the pattern of the component and substrate to be interconnected. A pattern can be defined photolithographically on a sacrificial metal carrier. The pattern can also be a random dispersion as long as xy isolation is maintained. The interconnecting filaments are then electroplated. The photomask is removed with the defined islands of electroplated metal filaments remaining. A dielectric adhesive is potted around the metallurgical islands. The plated metallurgy is released with the adhesive film by preferentially etching the film's sacrificial metal carrier (cathode).

In another embodiment, a layer of dielectric adhesive is formed on a metal carrier. A metallic mask is placed on the adhesive layer and through-holes are then laser ablated in the adhesive layer. The through-holes correspond with recesses embossed in the metal carrier. The mask is removed, and the islands of metal filaments are electroplated to fill the through-holes. The metal carrier is then removed.

The dielectric adhesive films will be aligned to chip, card or substrate pads than aligned and thermally laminated to a mating pad surface for electrical connection and encapsulation. The adhesive may also contain dispersed (dielectric) fillers to tailor thermal conductivity and thermal expansion to the intended application.

DETAILED DESCRIPTION OF THE INVENTION

The present invention is directed to a dielectric adhesive film patterned with isolated clusters of electrically conductive particles that extend within or through the film thickness. The particles are comprised of a plurality of branched metallic filaments which can be dendritic in form. The dielectric adhesive film with the electrically conductive clusters provides electrical interconnection and encapsulation for low impedance, reworkable, solder-free electrical joining. These patterned clusters can interconnect over gaps as much as 0.002". The continuous metal filaments eliminate problems inherent to adhesives that rely on particle-to-particle contact for electrical conduction. Highly reliable interconnection to conductor pads is achieved with multiple fine point features that provide high stress contact with low normal force.

Figure 1:
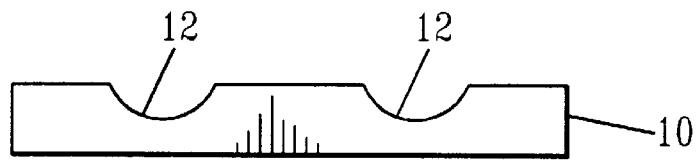
FIGS. 1, 2, 2*a* and 3 are schematic drawings showing the steps in one method of fabricating the dielectric adhesive film interconnect structure of the present invention.

Fabrication of these films begins by plating a preselected pattern of the clusters of highly branched metallurgical filaments. The pattern is selected to match the pattern of the component and substrate to be interconnected. Referring now to the drawings, the process of forming the film begins with the selection of a sacrificial substrate material. As shown in FIG. 1, a layer 10 of the metal to be plated to form the clusters is first provided with a plurality of depressions 12. The depressions are patterned according to the pattern of contacts to be interconnected. As noted above, a random pattern can also be employed. The pattern can be defined photolithographically and the depressions formed by embossing or other means. The depth of the embossment will correspond to the desired distance the cluster is to extend beyond the surface of the film.

Figure 2:
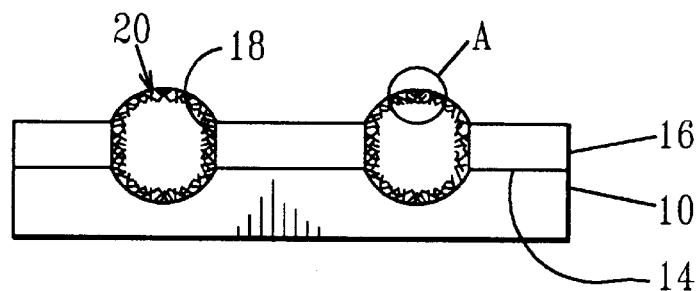
Figure 2A:
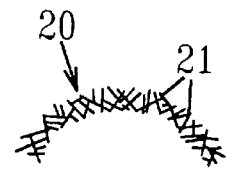

In the next step, a photomask 16 is deposited on the top surface 14 of the metal layer 10 with the openings 18 being aligned with the embossed areas 12. The pattern of the mask can be defined photolithographically on the sacrificial metal carrier 10. Thereafter, the interconnecting clusters 20 are electroplated. The electroplating method is conventional with the exception of utilizing a high current density, in the range of 100 to 1000 milliamps/cm$^2$. The high current density causes the plating of the metal through the mask such that the clusters are comprised of branched metallic filaments that are dendritic-like. See FIG. 2*a* which is a close-up of area A of cluster 20.

Figure 3:
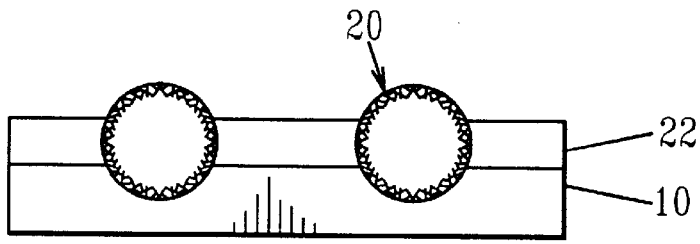
Figure 4:
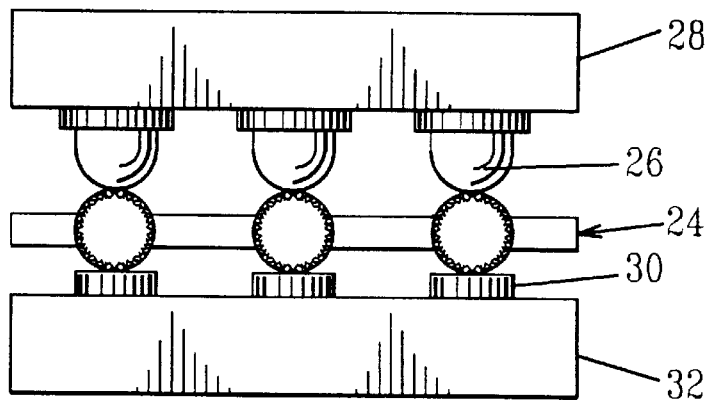
FIG. 4 is a schematic drawing showing the interconnection of the device by the dielectric adhesive film of the present invention.

The photomask 16 is then removed with the defined clusters 20 of electroplated metallurgical filaments 21 remaining. A dielectric adhesive layer 22 is thereafter potted around the metallurgical clusters to form a dielectric adhesive film with a pattern of clusters of electrically conductive interconnects, as shown in FIG. 3. The plated metallic clusters are released with the adhesive film by preferentially etching the film's sacrificial metal carrier 10. As shown in FIG. 4, the released film 24 is aligned to the chip, card or substrate pads, such as the C4 pads 26 of a chip 28 and thermally laminated to a mating contacts pads 30 of a substrate 32 for electrical connection and encapsulation. The adhesive may also contain dispersed (dielectric) fillers to tailor thermal conductivity and thermal expansion to the intended application.

Figure 5:
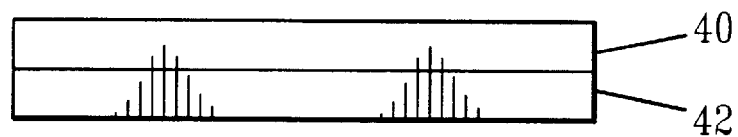
FIGS. 5–9 are schematic drawings showing the steps in a second method of fabricating the dielectric adhesive film interconnect structure of the present invention.
Figure 6:
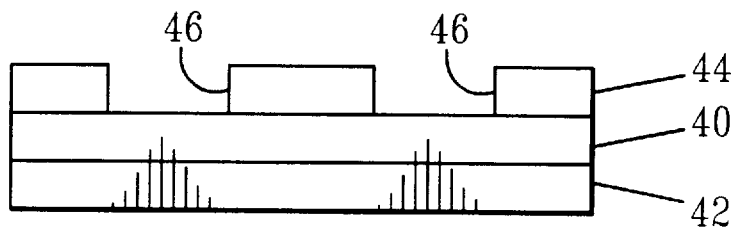
Figure 7:
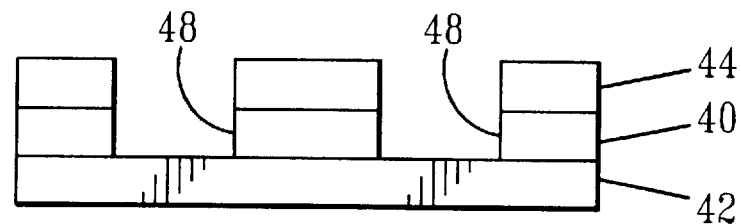
Figure 8:
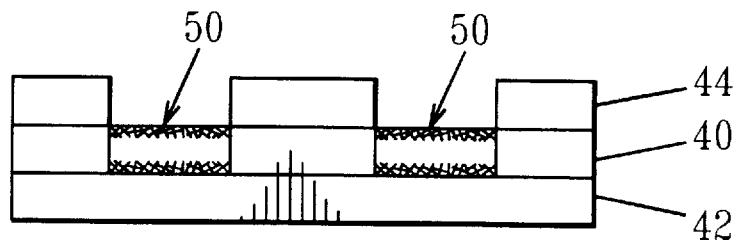
Figure 9:
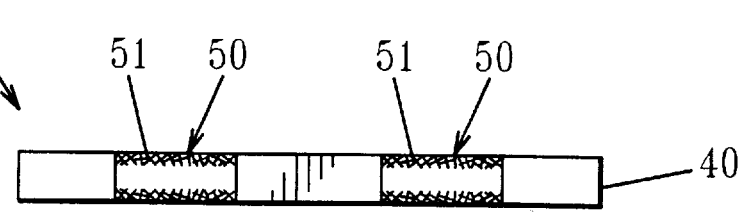

In an alternative method of fabrication, a layer of dielectric adhesive 40 is formed on the top surface of the carrier substrate 42 (FIG. 5). A preformed metallic mask 44 is then placed on top of the adhesive layer. The metallic mask will have openings 46 patterned to align with areas that may or may not be embossed (FIG. 6). The adhesive layer is then laser ablated through the openings in the metal mask to form openings 48 (FIG. 7). The clusters 50 are then plated through the openings in the adhesive layer (FIG. 8). Thereafter, the metal mask and the carrier layers are removed, leaving the interconnect structure 52 comprising the dielectric adhesive film with the patterned clusters of electrically conductive filaments 51 (FIG. 9).

The selectively filled adhesive film of the present invention will improve the electrical performance and simplify the processing associated with conventional isotropic electrically conductive adhesives. Orientation of the rod-like or dendritic-like filaments will minimize the dependence on particle-to-particle contact for continuity. Use of the freestanding film 24 will eliminate the concerns over dispensing rheology and will allow for increased filler concentrations where interconnection is intended.

The selective filling would be an improvement over anisotropic conductive adhesives. Conventional anisotropic films are randomly and uniformly loaded with fillers so that in the XY plane particle-to-particle interconnectivity is statistically unlikely over some minimum distance. To provide finer pitches, filler loading is decreased to decrease the distance over which XY communication is statistically possible. The drawback is that in the area of interconnecting pads-to-pads, the particle density has decreased. Thus, fewer particles make the z-axis connection per unit area and the reliability degrades. Unlike conventional anisotropic films, selective filling allows localized conductor concentrations higher than the critical volume fraction for bulk conductivity. Electrical isolation is guaranteed by regions of adhesives that do not contain electrically conductive filler. These films would be gap filling.

The present invention provides the following features and advantages:

1. A composite film containing oriented electrically conductive clusters patterned at a photolithographic resolution in a dielectric adhesive matrix.

2. A process for simultaneous electrical interconnection and encapsulation.

3. A means for electrical interconnection that is re-workable through heat or selective dissolution.

4. A z-axis conductive adhesive film with gap filling capability.

5. A high stress, low normal force z-axis conductive adhesive film.

6. Branched filaments capable of penetrating insulating films on carrier and component pads.

7. Denser fine pitch capability than allowed with current z-axis adhesives.

8. Control over bulk film thermal conductivity and thermal expansion with addition of dispersed electrically insulating fillers.

9. Control over joining temperature by manipulation of adhesive composition. Joining below the degradation temperature of epoxies is possible.

10. Electroplated clusters with low bulk resistivity whose sharp pointed contact surfaces provide a penetrating large surface area, stable, low contact resistance contact mechanism.

Furthermore clusters that are 50 microns in diameter can accommodate more out-of-flatness than a monosized particle of 10 microns which is typical of anisotropic adhesives. The dendritic filaments are palladium and do not pose the same migration concern as silver. These solid metallic features provide sharp asperities that penetrate films on metal surfaces and maintain high normal stresses to ensure stable contact resistance. The present invention has better x y isolation since the clusters of dendritic filaments can be patterned. In addition, the interconnects have lower total contact resistance because of the dense packing of dendritic filaments. Patterning is a method to improve contact resistance. Typically, anisotropic adhesives use random particle dispersion below the percolation threshold loading to insure that x y plane communication does not occur. With patterning, particle density can be increased because particles are placed only where desired, at interconnect points. Patterning is accomplished by mechanically perforating the adhesive matrix or by laser ablation. A conductive paste material is screened to fill the perforations. The following are three embodiments of fabrication:

1. Dendrites could be plated randomly on a metal surface at a density where the x y insulation is insured. An adhesive could be flowed, screened, sprayed or spin coated to contain the field of dendrites. The metal substrate on which the dendrites were plated can be chemically etched to release an anisotropically electrically conductive adhesive film.

2. Use a photolithographic process to define a pattern in an adhesive film and then plate dendrites in the patterned holes.

3. Interconnect pads of either one or both adherents to be bonded can be prepared with dendrites. A non-conductive adhesive can be placed between the aligned adherents. Appropriate temperature, force and dwell time is applied to squeeze the adhesive so that dendrites of one surface make electrical contact with the second surface. The adhesive could be either a reworkable thermoplastic material or a thermosetting non-reworkable material. The pointed features of a dendrite provide reliable contact at low normal stress (20 grams).

Deposition of branched metallurgical filaments has been demonstrated with palladium electroplating on nickel or copper substrates. However, any noble metal can be used as the plating material. Metallurgy is patterned with established photolithographic processing. Dielectric adhesive films are available in commercial or in-house compositions (e.g. thermoplastic polyimide siloxane or polysulfone). These adhesives have been thoroughly characterized in noble-metal-filled isotropic conductor applications.

The disclosed could be used in microelectronics industry for device interconnection or direct chip attach in low- to high-end packaging of ceramic, epoxy, TAB or flex connectors and substrates.

The disclosed provides an alternative to solder for electrical joining. Selectively filled adhesive films offer simplified processing, increased range of application, and improved performance over available interconnect technologies. The films integrate electrical interconnection and encapsulation processes. The films are applicable to interconnections with coplanarity tolerances requiring gap-filling.

The dendritic clusters of the present invention have the advantage of high stress points at asperity-asperity contacts, providing intrinsically lower and more stable contact resistance. Plus, there is the ability of thicker interconnect gaps with dendrites (50 microns vs. 10 microns). Coplanarity and flexibility requirements are less rigorous compared to the prior art.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new and desire to secure by Letters Patent is:

1. An interconnection and encapsulation structure comprising:

a dielectric adhesive film having opposed first and second surfaces and a plurality of through-holes extending from said first surface to said second surface;

each of said through-holes being filled with a cluster or electrically conductive filaments which are substantially dendritic in form extending beyond said first and second surfaces.

2. The structure of claim 1 wherein the dielectric adhesive film comprises a thermoplastic material.

3. The structure of claim 2 wherein the thermoplastic material is polyimide siloxane.

4. The structure of claim 2 wherein the thermoplastic material is polysulfone.

5. An interconnection and encapsulation structure comprising:

a first substrate having a plurality of first contact locations;

a second substrate having a plurality of second contact locations;

a dielectric adhesive film having a plurality of interconnect cluster means comprising a plurality of electrically conductive filaments which are substantially dendritic in form extending through said film, said film being sandwiched between said first and second substrate, said plurality of interconnect cluster means electrically connecting said first and second contact locations.

6. The structure of claim 5 wherein said film encapsulates electrical circuit components at said first and second contact locations.

7. The structure of claim 6 wherein said electrical circuit components includes means for forming an electrical connection to an electrical circuit.

8. The structure of claim 5 wherein said plurality of electrically conductive filaments extend through a corresponding plurality of through-holes at pre-selected locations in said dielectric adhesive.

9. The structure of claim 5 wherein the dielectric adhesive film comprises a thermoplastic material.

10. The structure of claim 9 wherein the thermoplastic material is polyimide siloxane.

11. The structure of claim 9 wherein the thermoplastic material is polysulfone.

12. The structure of claim 1 wherein the dielectric adhesive film contains dispersed dielectric fillers to preselect the thermal conductivity and thermal expansion of said film.

13. An interconnection structure comprising:

a dielectric adhesive film having opposed first and second surfaces and a plurality of through-holes extending from said first surface to said second surface;

each of said through-holes being filled with a cluster of electrically conductive filaments.

14. The structure of claim 13 wherein the dielectric adhesive film comprises a thermoplastic reworkable material.

15. The structure of claim 13 wherein the dielectric material is a thermoset non-reworkable material.

16. An interconnection and encapsulation structure comprising:

a first substrate having a plurality of first contact locations;

a second substrate having a plurality of second contact locations;

a dielectric adhesive film having a plurality of interconnect cluster means comprising a plurality of electrically conductive filaments which are substantially dendritic in form, said film being sandwiched between said first and second substrate, said plurality of interconnect cluster means electrically connecting said first and second contact locations.

17. The structure of claim 16 wherein said film encapsulates electrical circuit components at said first and second contact locations.

18. The structure of claim 17 wherein said electrical circuit components includes means for forming an electrical connection to an electrical circuit.

19. The structure of claim 16 wherein said plurality of interconnect cluster means fill through-holes at preselected locations in said dielectric adhesive.

20. The structure of claim 16 wherein the dielectric adhesive film comprises a thermoplastic material.

21. The structure of claim 16 wherein the dielectric adhesive film comprises a thermoset non-reworkable material.

22. The structure of claim 13 wherein the dielectric adhesive film contains dispersed dielectric fillers to preselect the thermal conductivity and thermal expansion of said film.

* * * * *